United States Patent [19]

Morris

[11] Patent Number: 5,024,992

[45] Date of Patent: Jun. 18, 1991

[54] PREPARATION OF HIGHLY OXIDIZED RBA2CU4O8 SUPERCONDUCTORS

[75] Inventor: Donald E. Morris, Kensington, Calif.

[73] Assignee: The Regents of the University of California, Oakland, Calif.

[21] Appl. No.: 542,672

[22] Filed: Jun. 22, 1990

Related U.S. Application Data

[63] Continuation of Ser. No. 263,750, Oct. 28, 1988, abandoned.

[51] Int. Cl.$^5$ .................... C01B 13/14; C01B 13/32; C01F 11/02; H01L 39/12

[52] U.S. Cl. ......................................... 505/1; 252/521; 423/596; 423/604; 501/123; 501/126; 501/152; 505/742; 505/780

[58] Field of Search ........................... 505/1, 742, 780; 423/596, 604; 252/521; 501/152, 123, 126

[56] References Cited

PUBLICATIONS

Narayan, "Microstructure and Atomic Structure Correlations...", *Reviews of Solid State Science*, vol. 2 (2 & 3), 1988, pp. 517–537.
Eaglesham, "New Phases in the Superconducting Y:-Ba:Cu:O System", *Appl. Phys. Lett.*, vol. 51 (6), 10 Aug. 1987, pp. 457–459.
Char, "Properties of Y-Ba-Cu-O Thin Films with Ordered Defect...", *Phys. Review B*, vol. 38, No. 1, Jul. 1, 1988, pp. 834–837.
Marsh, "Crystal Structure of the 80K Superconductor YBa$_2$Cu$_4$O$_8$", *Nature*, vol. 334, Jul. 14, 1988, pp. 141–143.
Marshall, "Ordered-Defect Structure in Epitaxial YBa$_2$Cu$_3$O$_{7-x}$...", *Physical Review B*, vol. 37, No. 16, Jun. 1, 1988, pp. 9353–9358.
Rao, "Superconductivity Studies on the High-Tc Phases in Y..O Ba...Cu...O", *Jpn. Jnl. Appld. Phys.*, Part 1, vol. 26 (Suppl. 26-3), 1987 (abstract).
Bordet, "Structure Determination of the New High-Temperature...Y$_2$Ba$_4$Cu$_7$O", *Nature*, vol. 334, Aug. 18, 1988, pp. 596–598.
Uno, "Synthesis of Superconductive Oxides by Vacumm Calc. Method", *Jap. Jnl. of Applied Physics*, vol. 27, No. 6, Jun. 1988, pp. L1003–L1006.
Robinson, "Effect of Oxidizing Atmosphere on Superconductivity...", *Mat. Res. Soc. Symp.*, vol. 99: High-Temp. Superconduct., Dec. 1987, pp. 587–590.
Frase, "Phase Compatibilities in the System Y$_2$O$_3$-BaO-CuO", *Adv. Ceramic Mat'ls*, vol. 2, No. 3B, Special Issue, 1987 (Jul.), pp. 295–302.
Karpinski et al., *Nature* (1988), 336:660–662.
Shinn et al., *Synthetic Metals* (1989), 29:F709–F714.
Schirber et al., *Physica C* (1988), 152:121–123.
Schirber et al., *Matl. Res. Soc. Symp. Proc.* (1988), 99:479–481.
Dabrowski et al., *Superconductivity and its Applications*, Kwok and Shaw, eds, (Apr. 18–20, Buffalo, NY), Elsevier, 141–145 (1988).

Bormann et al., *Appl. Phys. Lett.* (1989), 54:2148–2150.
Morris et al., *Proceedings of Symposium S* (Apr. 23–24, 1987; Anaheim, CA).
Bordet et al., *Nature* (1988), 334:595–598.
Karpinski et al., *Nature* (1988), 331:242–245.
Karpinski et al., *Physica C* (1988), 153–155:401–402.
Karpinski et al., *Physica C* (1988), 153–155:830–831.
Cava et al., *Nature* (1989), 338:328–330.
Marsh et al., *Nature* (1988), 334:141–143.
Karpinski et al., *Nature* (1988), 336:660–662.
Morris et al., *Physica C* (1989), 159:287–294.
Morris et al., preprint.
Morris et al., *Phys. Rev. B* (1989), 39:7347–7350.
Morris et al., this paper was not published.
Viegers et al., *J. Mater. Res.* (1987), 2:743–749.
Narayan et al., *Appl. Phys. Lett.* (1987), 51:940–942.
Zandbergen et al., *Nature* (1988), 331:596–599.
Kogure et al., *Physica C* (1988), 156:35–44.
Marshall et al., *Phys. Rev. B* (1988), 37:9353–9358.
Kwo et al., *Appl. Phys. Lett.* (1988), 52:1625–1627.
Char et al., *Phys. Rev. B* (1988), 38:834–837.
Mandich et al., *Phys. Rev. B* (1988), 38:5031–5034.
Kogure et al., *Physica C* (1988), 156:45–56.
Schneemeyer et al., *Nature* (1987), 328:601–603.
Gallager, *Adv. Ceram. Mater.* (1987), 2:632–639.
Kishio et al., *Jpn. J. Appl. Phys,* (1987), 26:L1228.
Specht et al., *Phys. Rev. B* (1988), 37:7426–7434.
Tarascon et al., *Science* (1987), 235:1373–1376.
Beille et al., *Physica* (1987), 146B:307–311.
Demazeau et al., *Physica C* (1988), 153–155:824–825.
Torrance et al., *Phys. Rev. Lett.* (1988), 61:1127–1130.
Terada et al., *Physica C* (1988), 153–155:976–977.
Djurek et al., preprint.
Ginley et al., *J. Crystal Growth Special Ed. on High Tc* (preprint; accepted for publication).
Uno et al., *Jap. J. Appl. Phys.* (1988), 27:L1003–L1006.
Torrance and Metzger, preprint.
Hazen et al. (1989), *Applied Phys. Lett.*, 54:1057–1059.
Shannon, *Acta Crystallog* (1976), A32:751–767.
Johnston, *High Tc Update* (1989), 3:1.
Beno et al., *Appl. Phys. Lett.* (1987), 51:57–59.
Capponi et al., *Europhys. Lett.* (1987), 3:1301–1307.

*Primary Examiner*—Paul Liberman
*Assistant Examiner*—John Boyd
*Attorney, Agent, or Firm*—Townsend and Townsend

[57] ABSTRACT

Novel superconducting materials in the form of compounds, structures or phases are formed by performing otherwise known syntheses in a highly oxidizing atmosphere rather than that created by molecular oxygen at atmospheric pressure or below. This leads to the successful synthesis of novel superconducting compounds which are thermodynamically stable at the conditions under which they are formed. The compounds and structures thus formed are substantially nonsusceptible to variations in their oxygen content when subjected to changing temperatures, thereby forming a temperature-stable substantially single phase crystal.

14 Claims, No Drawings

PREPARATION OF HIGHLY OXIDIZED RBA$_2$CU$_4$O$_8$ SUPERCONDUCTORS

GOVERNMENT RIGHTS

The invention described herein arose in the course of or under Contract No. DE-AC03-76-SF-00098 between the Department of Energy and the University of California at Berkeley.

This is a continuation of Ser. No. 263,750, filed on Oct. 28, 1988, now abandoned.

This invention relates to superconductor systems, and in particular to crystalline structures having superconducting properties.

BACKGROUND OF THE INVENTION

Theoretical and experimental research in the field of superconducting materials by thousands of researchers has led to the discovery of a handful of oxide compounds which become superconducting at relatively high temperatures ($T_C$), i.e., within the range of 40–126 K. All of the known high temperature superconductors are oxides, and contain (1) copper and/or bismuth, (2) barium or other alkaline earths such as strontium or calcium, and (3) trivalent elements such as yttrium. Rare earth elements 57 to 71 (lanthanum to lutecium), thallium or bismuth are substituted for yttrium in some materials. Notable superconductors are as follows:

(1) oxide materials containing lanthanum, strontium and copper, bearing the formula La$_{2-x}$Sr$_x$CuO$_4$, commonly referred to as L-S-C-O;

(2) oxide materials containing yttrium, barium and copper, bearing the formula YBa$_2$Cu$_3$O$_{7-\delta}$, commonly referred to as 1-2-3 (rare earth elements can be substituted for yttrium, and the resulting compounds are also superconducting);

(3) oxide materials containing bismuth strontium, calcium and copper, bearing such formulas as Bi$_2$CaSr$_2$Cu$_2$O$_{8+x}$ and commonly referred to as B-C-S-C-O;

(4) oxide materials containing thallium, barium, calcium and copper, bearing such formulas as Tl$_2$Ba$_2$CuO$_x$, Tl$_2$CaBa$_2$Cu$_2$O$_x$, Tl$_2$Ca$_2$Ba$_2$Cu$_3$O$_x$, Tl$_2$Ca$_3$Ba$_2$Cu$_4$O$_x$, TlCaBa$_2$Cu$_2$O$_x$, and TlCa$_2$Ba$_2$Cu$_3$O$_x$, commonly referred to as T-C-B-C-O; and (5) oxide materials containing bismuth, barium, potassium and copper, bearing the formula Ba$_{1-x}$K$_x$BiO$_3$, identified as B-K-B-O.

Each of these high temperature superconducting materials has drawbacks. For example:

La$_{2-x}$Sr$_x$CuO$_4$ has a $T_C$ of only 40 K.

YBa$_2$Cu$_3$O$_{7-\delta}$ has an oxygen content which varies with temperature, and is only superconducting when the oxygen content is high ($\delta < 0.4$). A unique feature of the 1-2-3 compound is the variable oxygen stoichiometry, and rapid and reversible oxidation/reduction above 400° C. Changing the oxygen content changes the superconducting transition temperature $T_C$ and also the normal state resistivity. The required high oxygen content is only reached in equilibrium at low temperatures ($\sim$400° C.). At relatively high temperatures, the oxygen content of the crystal structure has an equilibrium value which is lower than the equilibrium value at lower temperatures. Temperature changes encountered during the processing of this material thus brings about changes in chemical composition and crystal structure, occurring slowly and nonuniformly. At the high temperatures needed for synthesis, grain growth and densification, the oxygen loss is severe, and is frequently accompanied by the formation of a liquid phase and the reordering of the crystal structure to segregate the material into two solid phases as the liquid phase resolidifies. The presence of two phases of different crystal structure and empirical composition is detrimental to the uniformity of atomic structure near grain boundaries and introduces certainty and nonuniformities in the critical temperature. In addition above about 700° C., with loss of oxygen, the structure changes from orthorhombic to tetragonal. During cooling after synthesis, the structure changes back to orthorhombic as oxygen is absorbed. The existence of two phases gives rise to internal stresses in the material during cooling, causing twinning and its associated detrimental effects.

B-C-S-C-O has a soft flaky structure, while T-C-B-C-O contains highly toxic thallium. B-K-B-O is extremely sensitive to moisture and decomposes readily. In addition. B-K-B-O has a very low $T_C \approx 30$ K.

Materials (1), (2), (3) and (4) all contain copper as an essential constituent. The copper in these materials is in a highly oxidized state, with a formal valence greater than +2. This means that either some of the copper is in the rare trivalent state, or the oxygen is of a valency smaller than the normal −2.

The need for additional high temperature superconductors is great, not only to achieve superconductors with higher $T_C$'s, but also to achieve superconductors with improved mechanical properties, stability and ease of processing. The discovery and study of new high temperature superconductors varying in composition and structure also provides the benefit of insight into the superconducting phenomenon, which will aid in finding a theoretical explanation. This will lead to a more systematic design of superconductors with needed properties.

SUMMARY OF THE INVENTION

It has now been discovered that novel superconducting materials in the form of compounds, structures or phases are formed by carrying out the synthesis in atmospheres which are highly oxidizing, i.e., having a substantially stronger oxidizing potential than an atmosphere of 100% molecular oxygen at atmospheric pressure. Such highly oxidizing atmospheres are achieved by molecular oxygen at superatmospheric pressures, by ozone at substantially any pressure, preferably atmospheric or superatmospheric, by atomic oxygen generated in a variety of ways at substantially any pressure, preferably atmospheric or superatmospheric, or by any compound which generates oxygen at oxidation potentials comparable to those created by the above systems.

It is well known that superconducting cuprates are all very highly oxidized compounds. All have copper in a valency higher than +2. For example, in the original La$_{2-x}$Sr$_x$CuO$_4$ superconductor, the average valency of Cu is 2.15, while in YBa$_2$Cu$_3$O$_x$, the average Cu valency is 2.33.

In accordance with the present discovery, when an oxide is heated, it tends to lose oxygen to its environment. Oxides therefore tend to be partially reduced by heating to high temperature, and compounds with relatively low oxygen content will be formed at high temperatures. This is particularly true when the metal has more than one possible valency. The reduction in oxygen content can be prevented by reacting the constituent metal oxides in high pressure oxygen. This will thermodynamically favor the formation of highly oxidized compounds or structures.

The present discovery leads to the expectation that many new superconductors will be discovered by the use of high pressure oxygen in the synthesis procedure, since this favors the formation of highly oxidized phases.

One result of the present discovery is the successful synthesis of novel superconducting compounds. It has been found that when powdered oxides of barium and copper in combination with a third metal are intimately mixed and then heated in high pressure oxygen to an elevated temperature, they will react to form superconducting compounds with novel composition, structure and properties. The new compounds are thermodynamically stable under the conditions of temperature and oxygen pressure at which they are formed. In addition, however, the new compounds and structures are substantially nonsusceptible to variations in the oxygen content when subjected to changing temperatures, thereby forming a temperature-stable substantially single phase crystal, lacking the problems delineated above in association with the yttrium-barium-copper-oxygen superconducting materials of the prior art.

In one embodiment of the invention, the invention resides in superconducting materials having the empirical formula $RBa_2Cu_4O_8$, where R is either yttrium or a rare earth metal, and this material is formed by heating the metals or compounds of the various metals involved, which compounds may each contain one or more than one metal and may themselves be insulating or conductive or superconductive, in an oxygen-containing atmosphere at elevated pressure, substantially in excess of 1 atmosphere, at a temperature and time sufficient for interdiffusion and substantially uniform crystal formation to take place. The term "oxygen-containing atmosphere" is intended to include any gas or mixture of gases containing molecular oxygen. The term "substantially single phase lattice structure" is intended to include at most minor amounts of other phases of differing empirical formula, i.e., amounts which will have anything more than a negligible effect on the superconducting character of the material as a whole. The term as used herein is intended to include polycrystalline structures, i.e., grain networks where each grain is substantially identical in its empirical formula and crystalline lattice array.

It has also been found that barium may be partially substituted by strontium and/or calcium with similar results.

Under appropriate conditions of oxygen pressure and temperature, a different novel compound is formed. In this embodiment of the invention, the compound has the empirical formula $R_2Ba_4Cu_7O_x$, with $T_C \approx 40$ K.

This invention is not limited to the constituent elements of the 1-2-3 material, but is of general application to the synthesis of high temperature oxide superconductors.

Advantages of the present invention include the fact that the material can be prepared in thermodynamic equilibrium as bulk polycrystalline material, single crystals or thin films, rather than being formed as one phase in a structure containing multiple phases which cannot be isolated by practical means, and the fact that the material can be processed under a wide range of conditions with substantially no change in its superconducting properties.

Further features and advantages of the invention will become apparent from the description which follows.

DETAILED DESCRIPTION OF THE INVENTION AND PREFERRED EMBODIMENTS

The present invention is applicable to superconductor materials which contain or are fabricated from metals or metal oxides. Preferred metals have several valence states. Among these, copper and bismuth are particularly preferred.

These metals or metal oxides may be combined with other metals or metal oxides. Preferred among the latter are the divalent metals barium, strontium, calcium and cadmium, and other metals which also possess large electric polarizabilities, and trivalent metals such as yttrium, scandium, bismuth, thallium, transition metals, and the rare earth elements (lanthanum through lutecium). Preferred among the rare earth elements are neodymium, samarium, europium, gadolinium, dysprosium, holmium, erbium and thulium.

The metals used in the process by which the superconducting materials of the present invention are prepared may be in the form of the metals themselves, their oxides, nitrates, carbonates, oxalates, tartrates, and any other form which yields the oxide upon heating in oxygen.

The metals used in the process may also be in the form of mixed oxides or compounds, that is to say, compounds each of which incorporate more than one of the metals. In the preferred embodiment, the metal oxides are chosen to be in a chemical and physical form which will render them highly reactive at elevated temperatures. This may include use of finely divided oxides to provide large surface energies and chemical forms such as peroxides or mixed oxides which have lower chemical binding energy than the desired product or than other possible compounds which can be formed from the metals or metal oxides. Oxides are preferred. In the case of barium, the preferred compounds are BaO and $BaO_2$. In the case of copper, the preferred form is CuO. The other metals are generally preferred to be in their oxide form, a prominent example being yttrium oxide $Y_2O_3$. The metal compounds are combined in relative amounts such that the atomic ratio of the metals is approximately the same as that of the superconductor to be formed. For example, when the desired compound is $YBa_2Cu_4O_8$, the yttrium, barium and copper metals are combined in the ratio 1:2:4.

As an alternative, the metals or oxides can be combined by applying them in an intimate mixture as a coating on a suitable substrate to form a film on the substrate. This may be done by high vacuum evaporation, plasma coating, decomposition of organometallics, laser ablation coating or other known coating methods. As another alternative, a superconducting film of the desired 1-2-4 compound may be formed on a substrate of the 1-2-3 compound or another compound containing one or more of the constituent metals of the 1-2-4 compound by heating the substrate in concentrated or high pressure oxygen. In this case no film deposition at all is required if all of the constituents of the desired superconductor are incorporated in the substrate. Clearly the procedure may be reversed, and a film of the 1-2-3 superconductor may be formed on the surface of a 1-2-4 substrate by heating in an environment lacking high pressure or concentrated oxygen. Furthermore, patterning of films with different compounds being formed in different regions or through the thickness of the film may be achieved by heating the film while exposing only part of it to the appropriate oxygen environment. The resulting film is then heat treated in the following manner.

The general procedure for heating the constituent materials in accordance with the present invention is one involving an environment containing concentrated and/or active oxygen. The term "active oxygen" is intended to mean atomic oxygen or ozone.

Another means included in the scope of this invention to supply oxygen to form highly oxidized superconductive compounds is by oxygen which is incorporated in a chemical compound which will release it to aid in formation of a second highly oxidized compound which is a superconductor. Such oxygen supplying compounds include but are not limited to peroxides of the constituent metals. They also include other highly oxidized compounds which may themselves be superconductors. The constituent materials of the compound which is to be formed may be placed in contact with or mixed intimately with the compound which is to act as a source of oxygen.

A further means included within the scope of the invention to supply oxygen to form highly oxidized superconductive compounds is by means of electrical current such as in an electrochemical cell containing a suitable electrolyte such as, for example, $ZrO_2$ which provides oxygen to a substance placed in close proximity or in contact with it when electrical current is passed. This and the preceding means may reduce or eliminate the need for elevated temperature for synthesis of the desired compound.

The preferred procedure for heating the constituent materials in accordance with the present invention is one involving an oxygen-containing atmosphere at high temperature and high pressure. The oxygen-containing atmosphere is either a gas or a mixture of gases which contains molecular oxygen ($O_2$) or ozone ($O_3$) or atomic oxygen. Molecular oxygen is preferred. When molecular oxygen is used, the gas mixture is preferably at least about 50% molecular oxygen, more preferably at least about 90% oxygen, and most preferably substantially 100% molecular oxygen. With molecular oxygen, the pressure is substantially superatmospheric, preferably at least about 2 atmospheres, more preferably at least about 10 atmospheres, and most preferably at least about 60 atmospheres.

The temperature and heating time may vary, depending on the materials used. Higher temperatures will generally require less heating time.

In preferred embodiments, the heating is done at a temperature of at least about 700° C. for at least one hour, more preferably at least about 900° C. for about 10 hours.

The following examples are offered primarily for purposes of illustration, and are intended neither to limit nor define the invention in any manner.

EXAMPLES

Polycrystalline materials bearing the empirical formula $R_1Ba_2Cu_4O_x$ where R is Y, Nd, Sm, Eu, Gd, Dy, Ho, Er, and Tm were prepared as follows. Stoichiometric quantities of R oxide, BaO, and CuO powders (all 99% or better) were mixed thoroughly and pressed at 25 kg/mm$^2$ into 6 mm diameter pellets, which were calcined in oxygen held at 120 atmospheres pressure for 7 hours at 930° C. The reacted mixtures were then cooled at 5° C. per minute to 700° C., 2° C./min to 600° C., 1° C./min to 500° C., 0.5° C./min to 450° C., 1° C./min to 390° C., and furnace cooled at about 4° C./min. The mixtures were then finely ground with an agate mortar and pestle, pressed into 6-mm-diameter tablets at 25 kg/mm$^2$, and sintered in oxygen at the same temperature, pressure and time schedule as used for the calcining. In the case of the Ho, Er and Tm compounds, the calcining and sintering were both carried out at 60 atmospheres pressure at a maximum temperature of 980° C. Cooling rates were the same as described above. The pellets were wrapped in gold foil before the calcining and sintering operations were carried out; no reaction with the gold was observed. It was found that if the constituent oxides are mixed in the 1-2-3 stoichiometry instead of the 1-2-4 stoichiometry and then the process given in the first example herein is carried out, the result is the formation of the desired 1-2-4 compound along with residual phases which incorporate the excess Y and Ba oxides which are left over. In contrast, attempts made to synthesize the 1-2-4 compound from 1-2-3 compound by heating samples of the 1-2-3 compound in high pressure oxygen were unsuccessful. The 1-2-3 compound had been previously synthesized in the common way by heating the constituent oxides in oxygen at atmospheric pressure. Apparently conversion of the 1-2-3 compound to the 1-2-4 compound is more sluggish than formation from the constituent oxides and the time and/or temperature used in the attempt was insufficient for the conversion to take place.

The structures of the products were confirmed as single phase polycrystalline structures by transmission electron microscopy and x-ray powder diffraction. X-ray powder diffraction was performed on a Scintag automated powder diffractometer using Cu $K_\alpha$ radiation. Diffraction patterns of each of the samples were examined for evidence of the superconducting phases 1-2-4 and/or 1-2-3, as indicated by the presence of peaks at approximately 13.6 Å and 11.5 Å. respectively. For each of the samples that showed the 1-2-4 structure as the major phase, unit cell parameters were refined by the Reitveld method, assuming space group Ammm and the model structure reported in P. Marsh, et al., *Nature* 334, 141 (1988). These studies indicated that the atomic structure of the 1-2-4 phases was consistent with that of Marsh, et al. The lattice parameters are given in the table below.

The powder diffraction pattern for $YBa_2Cu_4O_8$ showed minor amounts of Ba cuprate and an unidentified phase (peaks at 7.49, 3.09 and 3.00 Å), but no evidence to a 1-2-3 component. Because, however, the calculated intensity of the diagnostic 11.5 Å line for the Y-bearing 1-2-3 compound is very weak (4.2%), a small amount of that material in the sample would not be revealed by x-ray diffraction. However, calculated powder patterns for 1-2-3 structure phases show that the intensity of the 11.4 peak increases with increasing atomic number of the element substituted for Y, e.g., to a relative intensity of 33% for the Eu and Gd cases. Therefore, even minor quantities of a 1-2-3 phase should be apparent in powder diffraction patterns of the rare-earth substituted samples. The pattern for the Dy sample indicated nearly pure 1-2-4 and no 1-2-3. The Sm and Nd sample patterns, however, showed both 1-2-3 and 1-2-4.

All the compounds were bulk superconductors and showed strong Meissner diamagnetic transitions. The $T_C$'s of the different compounds vary, and are correlated with lattice parameters a and b, and with orthorhombic distortion which increases for the heavier (smaller) rare earth ions. Axial ratios b/a range from 1.004 in $SmBa_2Cu_4O_8$ to 1.010 in $TmBa_2Cu_4O_8$. Although the Ho and Y compounds have nearly identical lattice parameters, the $T_C$ of $HoBa_2Cu_4O_8$ is about 3 K lower, possibly because the larger magnetic moment of Ho suppresses the coupling between the $CuO_2$ planes.

In the Eu and Gd systems, in addition to the 1-2-4 phase, an additional 2-4-7 phase was found, with alternating 1-2-3 and 1-2-4 blocks analogous to $Y_2Ba_4Cu_7O_x$. Diffraction peaks appearing at about 12.55 A are interpreted to be the 004 reflection of compounds with 2-4-7 structure. The lattice parameters of the 1-2-4 phase were determined by refining together with the 1-2-4 phase, with the results shown in the table. Although the 2-4-7 phase contains 1-2-3 blocks, axial ratios are even smaller than the corresponding 1-2-4 compounds. Also, the c axes of the 2-4-7 compounds are shorter than the sum of the corresponding 1-2-3 and 1-2-4 compounds, giving unit cell volumes approximately 0.6% smaller, and indicating larger Madelung energies. The same is true for $Y_2Ba_4Cu_7O_x$, according to the lattice parameters given by Bordet, P., et al., Nature 334,308 (1987), and using the values for $YBa_2Cu_4O_8$ from the table. Nearly pure polycrystalline materials bearing the empirical formulas $Eu_2Ba_4Cu_7O_x$ and $Gd_2Ba_4Cu_7O_x$ were prepared in exactly the same manner as described in the first example except that the pressure of oxygen used during calcining and during sintering was 30 atmospheres instead of 120 atmospheres. X-ray powder diffraction spectra of the samples showed the strong peak at the angle corresponding to a D-spacing of about 12.55 Å which is characteristic of the 2-4-7 compound, and no peaks were seen at the angles corresponding to the D-spacing of the 1-2-3 compound (11.6 Å) or of the 1-2-4 compounds (13.6 Å). Meissner diamagnetic curves indicated a large diamagnetic superconducting fraction with a critical temperature of about 40 K in both cases. Small diamagnetism persisted up to about 70 K indicating that a small fraction of 1-2-4 phase was also present. It is evident that at some synthesis pressure below 30 atmospheres but above one atmosphere the 1-2-4 phase would no longer form, and the entire sample would be 2-4-7 phase. Experiments were carried out in which other rare earth elements were substituted and calcining and sintering were carried out at 30 atmospheres pressure. X-ray powder diffraction measurements showed the presence of 1-2-4 and 2-4-7 phases and also phases with more complicated sequences of 1-2-3 and 1-2-4 phases than the simple alternation found in the 2-4-7 phase. In the case of holmium for example, phases were present with D spacings corresponding to sequences of 4 layers of the 1-2-3 structure followed by one layer of the 1-2-4 structure and sequences of 2 layers of the 1-2-3 structure followed by 3 layers of the 1-2-4 structure. Thus many new and more or less complex chemical and structural phases can be prepared by the use of this invention. All of the samples, with the exception of Nd, contained minor amounts of an unknown phase that had a characteristic diffraction peak at about 7.5 Å.

In the table, the superconducting temperature $T_C$ was determined by observation of bulk diamagnetism. Note that the $T_C$'s of the different compounds are significantly different, and are correlated with lattice parameters a and b, and with orthorhombic distortion which is larger for the heavier (smaller) rare earth ions. The symbol $\chi_{20K}$ represents the flux expulsion on cooling to 20 K in a constant Oe field, and is expressed in units of $10^{-4}$ emu/g. The symbol $4\pi\rho\chi_{20K}$ represents the diamagnetic volume fraction. The density $\rho$ is calculated from the measured unit cell volume. The superconducting fraction may be larger, because some expelled flux will be trapped in the pores of these ceramic samples. The relative amounts of the phases were estimated from x-ray powder diffraction patterns and Reitveld refinements. To determine the lattice parameters, the Reitveld procedure was used and a sample displacement correction was refined along with the unit-cell parameters. The refinement included 1-2-3 or 2-4-7 phases when present. The unit-cell parameters found for the Dy compound did not differ significantly from those determined using a $Cr_2O_3$ internal standard.

| | SUPERCONDUCTING AND STRUCTURAL PARAMETERS OF $RBa_2Cu_4O_8$ COMPOUNDS | | | | | | | | | | |
|---|---|---|---|---|---|---|---|---|---|---|---|
| | Superconducting Parameters | | | Phases Present | | | Lattice Parameters of 1-2-4 [2-4-7] Phase | | | | |
| R | $T_c(K)$ | $\chi_{20K}$ | $4\pi\rho\chi_{20K}$ | 1-2-3 | 2-4-7 | 1-2-4 | a (Å) | b (Å) | c (Å) | V (Å) | b/a |
| Y | 80.5 | −25 | 20% | no | no | all | 3.8395(2) | 3.8703(2) | 27.231(1) | 404.7 | 1.0080 |
| Nd | 57 | −3.5 | 3% | trace | no | minor | | | ~27.3 | | |
| Sm | 70 | −11 | 10% | 70% | no | 30% | 3.872(1) | 3.886(1) | 27.308(5) | 410.9 | 1.0036 |
| Eu | 68.5 | −24 | 21% | no | 40% | 60% | 3.8650(6) | 3.8837(5) | 27.279(4) | 409.5 | 1.0048 |
| | [~40] | [−10] | [9%] | | | | [3.879(2)] | [3.886(1)] | [50.39(3)] | [759.6] | [1.0018] |
| Gd | 73 | −18 | 16% | no | 60% | 40% | 3.867(1) | 3.881(1) | 27.26(1) | 409.1 | 1.0036 |
| | [~40] | [−9] | [8%] | | | | [3.868(2)] | [3.882(1)] | [50.43(2)] | [757.2] | [1.0036] |
| Dy | 77 | −19 | 17% | no | no | all | 3.8463(3) | 3.8726(3) | 27.237(1) | 405.7 | 1.0068 |
| Ho | 77 | −20 | 18% | no | no | all | 3.8404(6) | 3.8704(6) | 27.221(5) | 404.6 | 1.0078 |
| Er | 78 | −22 | 20% | no | no | all | 3.8366(5) | 3.8685(5) | 27.230(4) | 404.1 | 1.0083 |
| Tm | 77 | −11 | 10% | no | no | all | 3.827(1) | 3.864(1) | 27.18(1) | 401.9 | 1.0097 |

Comparing the data in the table for $YBa_2Cu_4O_8$ with that reported by Marsh, et al., referenced above, the lattice parameters are in general agreement, but with higher precision. The average value of the a and b crystallographic axes (3.855 Å) is close to that of 1-2-3 in both its orthorhombic (3.853 Å) and tetragonal (3.857 Å) variants. The axial ratio b/a=1.0080 corresponds to less than half the distortion of fully oxidized $YBa_2Cu_3O_7$ (b/a=1.017).

Phases in the polycrystalline samples were characterized by optical and electron microscopy, x-ray powder diffraction, and electron microanalysis. All phases appeared black and optically opaque, with average grain sizes no larger than one micron. Electron microanalyses of samples in the Y-Ba-Cu-O system were obtained on a JSM Model 35 scanning electron microscope, operated at 20 kV and 0.01 $\mu A$ beam current with a 2.5 $\mu m$ spot size. Standards included pure Cu metal, NBS microprobe standard K253 for Ba, and Y standard REE3 as described in Drake, M. J., et al., Chem. Geol. 10, 179 (1972). Portions of disks of the Y-Ba-Cu-O samples were embedded in epoxy cement and polished for microprobe analysis. Scanning electron microscopy of the polished surface revealed smooth areas well suited for electron microanalysis, as well as considerable intergranular porosity characteristic of ceramic superconductors.

The predominant phase in the Y-Ba-Cu-O samples was a ternary oxide with cation ratios of Y:Ba:Cu close to 1:2:4, though a few analyses yielded only 3.7 to 3.8 Cu per three of the Y/Ba. No analyses close to a 1:2:3 stoichiometry were obtained. From this it is concluded that the 2-4-8 compound was the predominant bulk superconductor in these samples. A second ternary compound, corresponding to the transparent green phase $Y_2BaCuO_5$, occurred in one point analysis. The absence of a green phase in the optical examination may imply a fine-scale mantling of the transparent 2:1:1 phase by opaque phases. In addition to the ternary compounds, occasional grains of an yttrium cuprate and a barium cuprate, both with 1:1 cation ratios, were observed.

Transmission electron microscopy (TEM), electron diffraction, and x-ray analytical electron microscopy (AEM) were performed on the yttrium compound using a Philips 420ST microscope equipped with an EDAX energy-dispersive detector and a PGT 4000 analyzer. Selected-area electron diffraction patterns and AEM analyses from numerous grains of the crushed sample confirmed the x-ray diffraction results that most of the material was well crystallized, bulk 2-4-8 structure. The data were consistent with the x-ray unit cell parameters and space group Ammm. Single crystals of the yttrium 1-2-4 phase were observed up to several tens of micrometers across. The electron diffraction patterns indicated that most of this pattern was well-ordered, though streaking parallel to the $c^*$ indicated that some crystals possessed some structural disorder affecting the periodicity of the (001%) planes.

High resolution lattice images showed that at least part of the disorder resulted from the insertion of occasional layers that were either smaller or larger than the 13.6 Å (002) layers of the ideal 1-2-4 structure. Similar defects have been observed in the Bi- and Tl-based high-$T_C$ superconductors and in $YBa_2Cu_3O_{7-\delta}$, all of the prior art. In the present material, a few ordered crystals of an additional pure Y-Ba-Cu phase with layer spacing of approximately 14.6 Å also were found. In addition to these complications related to layer spacing, electron diffraction patterns and lattice images from 1-2-4 indicated that many crystals were ordered parallel to the a axis, producing the modulations and superstructures in this direction having multiples of the 3.84 Å axis repeat.

The foregoing is offered primarily for illustrative purposes. It will be readily apparent to those skilled in the art that substitutions, modifications and variations in the procedures and materials disclosed above may be made without departing from the spirit and scope of the invention.

I claim:

1. A process for producing a superconducting material, said process comprising:
   (a) forming a composition by admixing (i) a compound of a metal selected from the group consisting of yttrium and rare earth metals with (ii) a compound of barium and (iii) a compound of copper, said compounds selected from the group consisting of oxides, nitrates and carbonates thereof, in relative amounts such that the atomic ratio of said metal to barium to copper in said composition is approximately 1:2:4;
   (b) heating said composition in an oxygen-containing atmosphere having an oxidizing potential greater than 50% molecular oxygen at a pressure of at least 30 atmospheres to a temperature and for a length of time sufficient to effect interdiffusion of said compounds and the formation of a substantially single phase crystalline or polycrystalline lattice structure having approximately the empirical formula $RBa_2Cu_4O_8$ where R is said metal of compound (i), which lattice structure is temperature stable at temperatures below about 750° C.

2. A process in accordance with claim in which said oxygen-containing atmosphere of step (b) is at least about 50% molecular oxygen.

3. A process in accordance with claim 1 in which said oxygen-containing atmosphere of step (b) is at least about 90% molecular oxygen.

4. A process in accordance with claim 1 in which said oxygen-containing atmosphere of step (b) is substantially 100% molecular oxygen.

5. A process in accordance with claim 1 in which said pressure of step (b) is at least about 50 atmospheres.

6. A process in accordance with claim 1 in which said pressure of step (b) is at least about 80 atmospheres.

7. A process in accordance with claim 1 in which said metal of compound (i) of step (a) is a member selected from the group consisting of yttrium, neodymium, samarium, europium, gadolinium, dysprosium, holmium, erbium and thulium.

8. A process in accordance with claim 1 in which said metal of compound (i) of step (a) is yttrium.

9. A process in accordance with claim 1 in which said compounds (i). (ii), and (iii) are oxides.

10. A process in accordance with claim 1 in which said compound (iii) is CuO.

11. A process in accordance with claim 1 in which said compound (ii) is a member selected from the group consisting of $BaCO_3$ and BaO, and said compound (iii) is CuO.

12. A process in accordance with claim 1 in which R is yttrium, said compound (i) is $Y_2O_3$, compound (ii) is BaO, and compound (iii) is CuO.

13. A process in accordance with claim 1 in which step (b) comprises heating said composition to a temperature of at least about 800° C. for at least about 8 hours.

14. A process in accordance with claim 1 in which step (b) comprises heating said composition to a temperature of at least about 900° C. for at least about 10 hours.

* * * * *